United States Patent
Ra et al.

(10) Patent No.: US 8,591,809 B2
(45) Date of Patent: Nov. 26, 2013

(54) SUBSTRATE TRANSFER CONTAINER, GAS PURGE MONITORING TOOL, AND SEMICONDUCTOR MANUFACTURING EQUIPMENT WITH THE SAME

(75) Inventors: Byung-Koog Ra, Yongin-si (KR); Tae-Sik Yun, Seoul (KR); Kunhyung Lee, Hwaseong-si (KR); Hyunjoon Kim, Seoul (KR); Hyeogki Kim, Hwaseong-si (KR); KiDoo Kim, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 13/048,153

(22) Filed: Mar. 15, 2011

(65) Prior Publication Data
US 2011/0220545 A1    Sep. 15, 2011

(30) Foreign Application Priority Data

Mar. 15, 2010  (KR) .................. 10-2010-0022928
Nov. 18, 2010  (KR) .................. 10-2010-0115102

(51) Int. Cl.
| | |
|---|---|
| G01N 21/00 | (2006.01) |
| G01N 31/00 | (2006.01) |
| G01N 33/00 | (2006.01) |
| G06F 11/30 | (2006.01) |
| G21C 17/00 | (2006.01) |
| B65B 1/30 | (2006.01) |
| B65B 3/26 | (2006.01) |
| B65B 1/04 | (2006.01) |
| B65B 3/04 | (2006.01) |
| B67C 3/02 | (2006.01) |
| H01L 21/20 | (2006.01) |
| H01L 21/36 | (2006.01) |
| C23C 16/24 | (2006.01) |

(52) U.S. Cl.
USPC ............. 422/62; 141/63; 141/89; 438/488; 438/905; 438/906; 702/185

(58) Field of Classification Search
USPC ............... 438/14, 300; 702/185; 250/288
See application file for complete search history.

(56) References Cited

U.S. PATENT DOCUMENTS

| | | | | |
|---|---|---|---|---|
| 5,988,233 A | * | 11/1999 | Fosnight et al. | 141/63 |
| 6,414,389 B1 | * | 7/2002 | Hume et al. | 257/732 |
| 7,790,479 B2 | | 9/2010 | Favre et al. | |
| 2006/0292037 A1 | | 12/2006 | Favre et al. | |
| 2007/0185687 A1 | * | 8/2007 | Speasl et al. | 702/185 |

FOREIGN PATENT DOCUMENTS

| | | |
|---|---|---|
| JP | 2002176097 | 6/2002 |
| JP | 2003224182 | 8/2003 |
| JP | 2006261675 | 9/2006 |
| KR | 1020060101332 | 9/2006 |

* cited by examiner

*Primary Examiner* — Jill Warden
*Assistant Examiner* — Julie Tavares
(74) *Attorney, Agent, or Firm* — Onello & Mello, LLP

(57) ABSTRACT

A substrate transfer container comprises a housing including a plurality of substrate slots positioned within a gas chamber having an interior environment. Each substrate slot accommodates a substrate undergoing a substrate manufacturing process, the interior environment of the gas chamber being selectively sealed from an exterior environment. A detection unit at the housing is constructed and arranged to detect an environmental property of the interior environment of the gas chamber, and to generate a detection signal in response. A signal transmission module at the housing is configured to wirelessly transmit a detection signal received from the detection unit.

4 Claims, 7 Drawing Sheets

SUBSTRATE TRANSFER CONTAINER, GAS PURGE MONITORING TOOL, AND SEMICONDUCTOR MANUFACTURING EQUIPMENT WITH THE SAME

CROSS-REFERENCE TO RELATED APPLICATIONS

This U.S. non-provisional patent application claims priority under 35 U.S.C. §119 of Korean Patent Application Nos. 10-2010-0022928, filed on Mar. 15, 2010, and 10-2010-0115102, filed on Nov. 18, 2010, the entire content of each being hereby incorporated by reference.

BACKGROUND

The present disclosure relates to a semiconductor manufacturing apparatus, and more particularly, to a substrate transfer container configured to accommodate a plurality of substrates, a gas purge monitoring tool configured to monitor a gas purge process of the substrate transfer container, and semiconductor manufacturing equipment including the substrate transfer container and the gas purge monitoring tool.

Semiconductor wafers are high-precision products that should be carefully stored and transferred to prevent contamination or damage that would otherwise be caused by external contaminants or physical impact. Particularly, careful attention is required when storing or transferring wafers to avoid contamination of the surfaces of the wafers by impurities such as dust, moisture, and organic matter. For these reasons, when storing or transferring wafers, it is necessary to house the wafers in a separate container for protecting the wafers from external physical impact and contamination.

SUMMARY

The present disclosure provides description of substrate transfer containers configured to monitor contamination of substrates, gas purge monitoring tools, and semiconductor manufacturing equipment including the substrate transfer containers or the gas purge monitoring tools.

In one aspect, a substrate transfer container comprises: a housing including a plurality of substrate slots, each substrate slot for retaining a substrate subject to a manufacturing process; a door constructed and arranged to seal an interior environment of the housing; a detection unit at the housing to detect an environmental property of the interior environment; and a signal transmission module configured to transmit a detection signal received from the detection unit.

In one embodiment, the signal transmission module comprises a wireless transmitter positioned at an outer wall of the housing.

In another embodiment, the signal transmission module further comprises a battery positioned at the wireless transmitter to supply power to the detection unit.

In another embodiment, the signal transmission module further comprises a flexible cable electrically connecting the detection unit and the wireless transmitter, wherein the flexible cable is positioned along an inner wall, an opening, and the outer wall of the housing.

In another embodiment, the detection unit comprises a mass sensor configured to determine an amount of AMCs (airborne molecular contaminants) present in the interior environment of the housing.

In another aspect, a gas purge monitoring tool is constructed and arranged to monitor whether a purge unit configured to supply a purge gas into a substrate transfer container operates normally. The gas purge monitoring tool comprises: a container; a gas chamber in the container, the gas chamber constructed and arranged to receive a purge gas supplied from a purge unit and to selectively vent the received purge gas; a detection unit configured to detect an environmental property of an interior environment of the gas chamber; and a signal transmission module configured to wirelessly transmit a detection signal received from the detection unit.

In one embodiment, the gas chamber comprises: a chamber body of the gas chamber positioned in the container; a purge gas inlet port at a lower portion of the chamber body; and a purge gas outlet port at an upper portion of the chamber body, wherein the purge gas inlet port and the purge gas outlet port penetrate an outer wall of the container.

In another embodiment, the purge gas outlet port has a cross-section taken in a direction perpendicular to a direction of purge gas flow between the lower portion and the upper portion that is smaller than a cross-section of the chamber body taken in a direction perpendicular to the purge gas flow direction.

In another embodiment, the chamber body comprises a metal material or metal alloy material.

In another embodiment, the detection unit comprises: a humidity sensor at the purge gas outlet port to measure humidity of purge gas discharged through the purge gas outlet port; and a pressure sensor at the chamber body to measure a purge gas pressure in the chamber body.

In another embodiment, the gas purge monitoring tool further comprises an identification number reader configured to read an identification number of a purge unit to which the gas purge monitoring tool is mounted.

In another aspect, semiconductor manufacturing equipment comprises: a clean room in which process apparatus are disposed to perform semiconductor manufacturing processes; and a substrate transfer container constructed and arranged to retain a plurality of substrates subject to a manufacturing process and to be transported among the process apparatus, wherein the substrate transfer container comprises: a housing including a plurality of substrate slots, each substrate slot for retaining a substrate subject to a manufacturing process; a door constructed and arranged to seal an interior environment of the housing; a first detection unit at the housing to detect an environmental property of the interior environment; and a first wireless transmitter configured to transmit a detection signal received from the detection unit.

In one embodiment, the semiconductor manufacturing equipment further comprises signal amplifiers positioned at a plurality of locations in the clean room and configured to amplify the detection signal transmitted from the first wireless transmitter and to transmit the amplified signal to a receiver.

In another embodiment, the signal amplifiers transmit the amplified signal to the receiver by radio waves.

In another embodiment, a position of the substrate transfer container in the clean room is determined based on overlapping reception regions of the signal amplifiers that receive the detection signal transmitted from the first wireless transmitter.

In another embodiment, the first detection unit comprises a mass sensor configured to measure an amount of AMCs present in the interior environment of the housing.

In another embodiment, the semiconductor manufacturing equipment, further comprises: a stocker housing positioned in the clean room; a plurality of support plates arranged vertically in the stocker housing to temporarily store the substrate transfer container; purge units respectively provided at the support plates to supply a purge gas to the substrate transfer container placed on the support plate; and a gas purge monitoring tool configured to monitor whether the purge units operate normally, wherein the gas purge monitoring tool comprises: a container constructed and arranged to be placed on a vacant one of the support plates; a gas chamber in the container, the gas chamber constructed and arranged to receive an inert purge gas supplied from purge unit and to selectively vent the received inert purge gas; a second detection unit configured to detect an environmental property of an interior environment of the gas chamber; and a second wireless transmitter configured to wirelessly transmit a detection signal received from the second detection unit to the signal amplifiers.

In another embodiment, the gas chamber comprises: a chamber body in the container; a purge gas inlet port at a lower portion of the chamber body; and a purge gas outlet port at an upper portion of the chamber body, wherein the purge gas outlet port has a cross-section taken in a direction perpendicular to a direction of purge gas flow between the lower portion and the upper portion that is smaller than a cross-section of the chamber body taken in a direction perpendicular to the purge gas flow direction, and wherein the purge gas inlet port and the purge gas outlet port penetrate an outer wall of the container.

In another embodiment, the second detection unit comprises: a humidity sensor at the purge gas outlet port to measure humidity of purge gas discharged through the purge gas outlet port; and a pressure sensor at the chamber body to measure a purge gas pressure in the chamber body.

In another embodiment, the gas purge monitoring tool further comprises an identification number reader configured to read identification numbers provided of purge units to which the gas purge monitoring tool is mounted and to and deliver the read identification numbers to the second wireless transmitter.

In another aspect, a substrate transfer container comprises: a housing including a plurality of substrate slots positioned within a gas chamber having an interior environment, each substrate slot to accommodate a substrate undergoing a substrate manufacturing process, the interior environment of the gas chamber being selectively sealed from an exterior environment; a detection unit at the housing constructed and arranged to detect an environmental property of the interior environment of the gas chamber, and to generate a detection signal in response; and a signal transmission module at the housing configured to wirelessly transmit a detection signal received from the detection unit.

In one embodiment, the housing further includes a door that opens and closes to selectively seal the gas chamber.

In another embodiment, the detection unit comprises one or more sensor units selected from the group consisting of: a mass sensor unit, a temperature sensor unit, a humidity sensor unit, a particle sensor unit, and a differential pressure sensor unit.

In another embodiment, the substrate container further comprises a battery at the housing constructed and arranged to supply power to the detection unit and the signal transmission module.

In another embodiment, the substrate container further comprises a gas inlet port in communication with the gas chamber for introducing a process gas into the gas chamber and a gas outlet port in communication with the gas chamber for removing process gas from the gas chamber.

BRIEF DESCRIPTION OF THE DRAWINGS

The accompanying drawings are included to provide a further understanding of the inventive concepts, and are incorporated in, and constitute a part of, this specification. The drawings illustrate exemplary embodiments of the inventive concept and, together with the description, serve to explain principles of the inventive concepts. In the drawings.

DETAILED DESCRIPTION OF EMBODIMENTS

Figure 1:
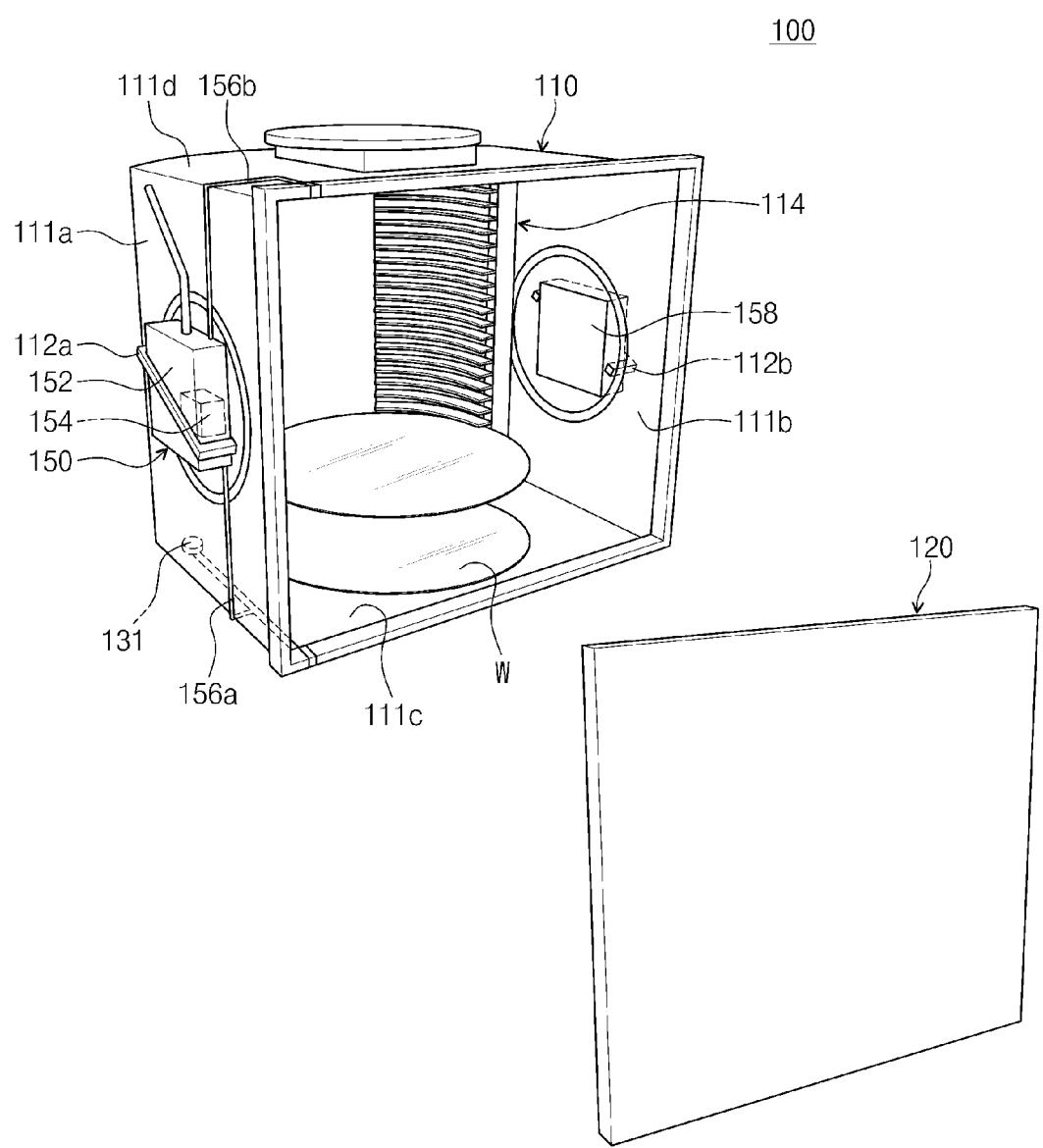
FIG. 1 is a perspective view illustrating a substrate transfer container according to an embodiment of the inventive concept.

With reference to the drawings, embodiments will now be described according to exemplary embodiments of the inventive concept. Like reference numerals are used for referring to the same or similar elements in the description and drawings. In the following description, well-known functions or constructions are not described in detail since they would obscure the inventive concept in unnecessary detail.

Figure 2:
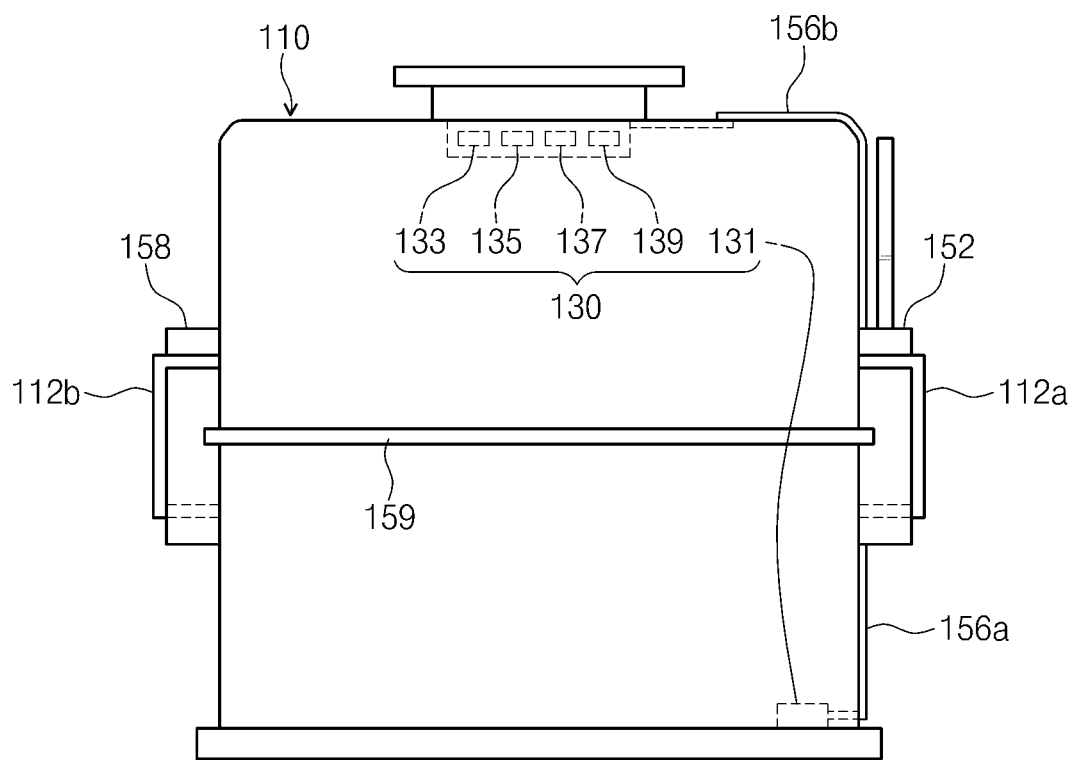
FIG. 2 is a rear view illustrating a housing of the type illustrated in FIG. 1.
Figure 3:
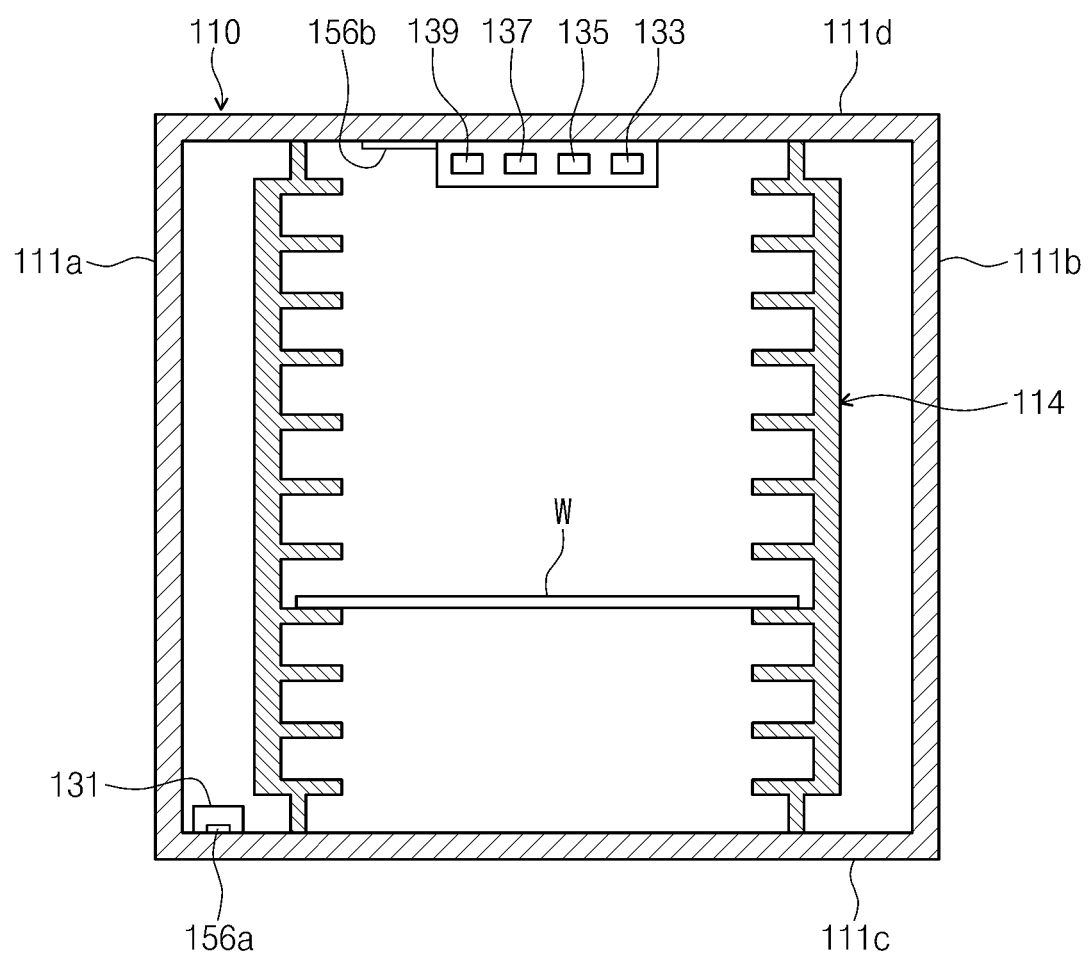
FIG. 3 is a sectional view illustrating the housing of the type illustrated in FIG. 1.

FIG. 1 is a perspective view illustrating a substrate transfer container 100 according to an embodiment of the inventive concept, FIG. 2 is a rear view illustrating a housing 110 of the type illustrated in FIG. 1, and FIG. 3 is a sectional view illustrating the housing 110 of the type illustrated in FIG. 1.

Referring to FIGS. 1 through 3, the substrate transfer container 100 is configured to accommodate a plurality of substrates that will be treated during a same processing step. During substrate processing, the substrate transfer container 100 is transported among process apparatus. In one embodiment, the substrate transfer container 100 can comprise a front opening carrier such as a front opening unified pod (FOUP).

The substrate transfer container 100 includes the housing 110, a door 120, a first detection unit 130, and a signal transmission module 150. The housing 110 is configured, or otherwise constructed and arranged, to accommodate substrates, for example semiconductor substrates or wafers used to form semiconductor circuits or light emitting diodes (LEDs), and the door 120 is used to close and open the housing 110. The first detection unit 130 is disposed in the housing 110. In various embodiments, the first detection unit 130 can be used to measure environmental properties in the housing 110, such as airborne molecular contaminants (AMCs), temperature, humidity, particle presence, types and sizes, and differential pressure. In the illustrated embodiment, the signal transmission module 150 is disposed on the outer wall of the housing 110. The signal transmission module 150 receives a detection signal from the first detection unit 130 through a wire and transmits the detection signal wirelessly, for example via radio waves, so that environmental properties of the housing 110, as measured by the first detection unit 130, can be monitored at a remote location.

In one embodiment, the housing 110 is in the shape of a container having a front side that can be opened. [-shaped, or U-shaped, handles 112a and 112b are coupled to the outer surfaces of both sidewalls 111a and 111b of the housing 110, and a plurality of slots 114 or receptacles are formed or otherwise provided in the housing 110 so that substrates (W) can be placed in the slots 114. In this example embodiment, the slots 114 are formed as brackets at opposed inner corners, or opposed sides, of the housing 110 in a manner such that the slots 114 can face each other. In this example embodiment, the slots 114 are horizontal so that the substrates (W) can be vertically arranged in a vertical stack. Substrates (W) such as wafers used to fabricate semiconductor devices or substrates used to fabricate light emitting diodes (LEDs) can be placed in the slots 114.

The opening in the front side of the housing 110 can be closed and opened using the door 120. In one example embodiment, the substrate transfer container 100 can be placed on a load port (not shown) of a process apparatus (not shown), and the door 120 can be closed/opened by a door opener (not shown) provided in a front end module (EFEM) (not shown) of an equipment unit of the process apparatus. Other mechanisms for opening and closing the door are equally applicable to the embodiments of the present invention, including automated manipulation, and manual manipulation, of the door 120. When the door is closed, the interior environment of the housing 110 provides a gas chamber within the housing 110 that can be substantially sealed from the exterior environment outside the housing.

The first detection unit 130 can include one or more of a number of sensors including, but not limited to: a mass sensor 131, a temperature sensor 133, a humidity sensor 135, a particle sensor 137, and a differential pressure sensor 139.

The mass sensor 131 can be configured to measure the amount of AMCs in the housing 110. The mass sensor 131 may comprise a quartz crystal microbalance (QCM). In one embodiment, the mass sensor 131 is disposed in the housing 110 at a location so as to not interfere with the insertion or removal of a substrate (W). For example, the mass sensor 131 can be disposed at an edge part of a bottom wall 111c of the housing 110. The mass sensor 131, for example in the form of a QCM, can include electrodes formed by coating both sides of a thin crystal plate with a metal. An AC voltage is applied to the electrodes to vibrate the crystal plate at a resonant frequency. If the weight of the electrodes of the QCM is varied under a condition where AMCs become attached to the electrodes, the resonant frequency of the crystal plate will likewise become varied. The weight variation of the electrodes can be detected as a result of the variation of the resonant frequency, and thus, the amount of AMCs present within the housing 110 can be determined.

AMCs such as ammonia ($NH_3$) and ozone ($O_3$) are smaller than particles and, unlike particles, are not visible. Various substrate defects and process errors can be caused by the presence of AMCs in the housing during various stages of processing. For example, the presence of ammonia ($NH_3$) can cause variation in the critical dimension (CD) of a photo-chemical-amplified resist pattern and a "T-top"-type defect, and the presence of ozone ($O_3$) can result in the formation of a natural oxide film.

Since the substrate transfer container 100 is an air-tight container, permeation of external contaminants into the container can be mitigated or prevented. However, AMCs generated in the substrate transfer container 100 often times cannot be discharged. Therefore, it may be desired to measure the amount of AMCs present in the substrate transfer container 100, and, in the event that the amount of AMCs exceeds a reference value, it may desired to take a certain action, such as interruption of a process.

The temperature sensor 133, the humidity sensor 135, the particle sensor 137, and the differential pressure sensor 139 can optionally be arranged in a line along an inner surface of a top wall 111d of the housing 110, or, alternatively, they may be individually disposed at various locations in the housing 110. The temperature sensor 133 is configured to measure the inside temperature of the housing 110. The temperature sensor 133 can comprise, for example, a resistance-based temperature detector having a temperature-dependant resistance or, alternatively a thermocouple-based detector that employs the thermoelectromotive force of a junction between different metals. The humidity sensor 135 is configured to measure humidity within the housing 110. The humidity sensor 135 can comprise, for example, an electric-resistance humidity sensor and a capacitance humidity sensor. The particle sensor 137 is configured to measure the number of micrometer-sized particles present in the housing 110. The differential pressure sensor 139 is configured to measure the difference in pressure of the interior of the housing relative to pressure exterior to the housing 110. In certain embodiments, the temperature sensor 133 and the humidity sensor 135 can be provided as individual units or as a single unit.

The signal transmission module 150 can be configured to receive environment-property detection signals from the sensors 131, 133, 135, 137, and 139 and wirelessly transmits the detection signals to a location remote the substrate transfer container 100, for example via radio waves. In one embodiment, the signal transmission module 150 includes a first wireless transmitter 152, a first battery 154, and first and second cables 156a and 156b. In the illustrated embodiment, the first wireless transmitter 152 is located or disposed on the outer wall of the housing 110. For example, the first wireless transmitter 152 can be disposed under a handle 112a of the housing 110. In one embodiment, the first battery 154 is embedded in the first wireless transmitter 152 to supply power to the sensors 131, 133, 135, 137, and 139 and associated signal processing equipment.

The first wireless transmitter 152 is electrically connected to the sensors 131, 133, 135, 137, and 139 through the first and second cables 156a and 156b. The first cable 156a electrically connects the mass sensor 131 to the first wireless transmitter 152, and the second cable 156b electrically connects the sensors 133, 135, 137, and 139 to the first wireless transmitter 152. The first and second cables 156a and 156b are routed on the housing 110 along the inner wall, openings, and outer walls of the housing 110, and are electrically connected to the first wireless transmitter 152. Thin, flexible cables cab be used as the first and second cables 156a and 156b. Since thin flexible cables are more readily pliable, they may be readily routed, and owing to their thin thickness, they are not likely to affect sealing between the door 120 and the housing 110 when the door 120 is closed. Power is transmitted from the first battery 154 to the sensors 131, 133, 135, 137, and 139 through the first and second cables 156a and 156b, and detection signals of the sensors 131, 133, 135, 137, and 139 are transmitted to the first wireless transmitter 152 through the first and second cables 156a and 156b.

A second battery 158 can optionally be positioned on the outer wall of the housing 110 as an auxiliary power supply unit. The second battery 158 can be configured to supply power to the sensors 131, 133, 135, 137, and 139 as a backup to the first battery when the first battery 154 becomes discharged. In one example embodiment, the second battery 158 can be positioned under the second handle 112b of the housing 110 and connected to the first wireless transmitter 152 through a connection cable 159. In alternative embodiments, the second battery 158 is not a backup to the first battery 154, but instead operates to supply power along with the first battery 154.

Other mounting positions and configurations for the signal transmission module 150, batteries 154, 158, cables 156a, 156b, 156c and sensors 131, 133, 135, 137, 139 are equally applicable to the present inventive concepts.

Figure 4:
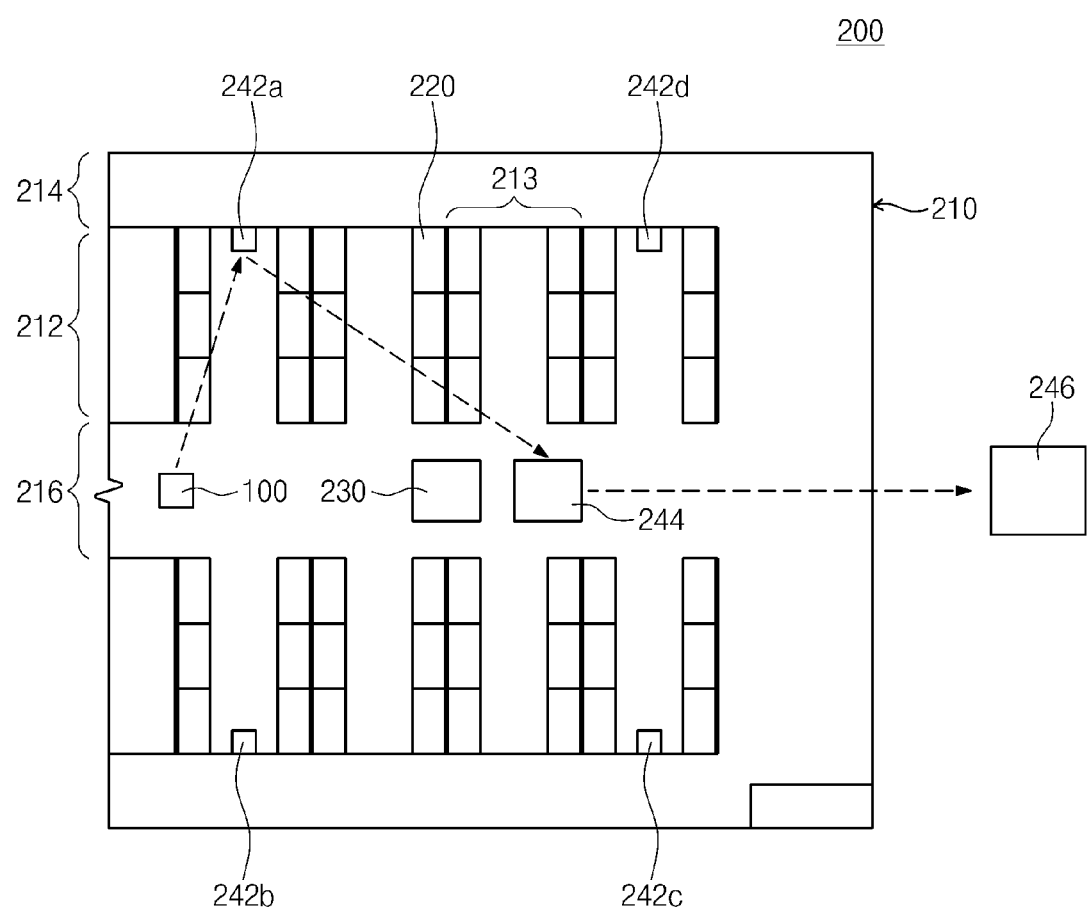
FIG. 4 is a plan view illustrating semiconductor manufacturing equipment according to an embodiment of the inventive concept.

FIG. 4 is a plan view illustrating semiconductor manufacturing equipment 200 according to an embodiment of the inventive concept.

Referring to FIGS. 1 through 4, the semiconductor manufacturing equipment 200 includes a clean room 210 and process apparatuses 220. The clean room 210 provides a process region 212, a service region 214, and a work region 216. The process region 212 is divided into a plurality of bays 213 which are arranged according to separate unit processes, and the process apparatuses 220 are disposed in the bays 213 so that the process apparatuses 220 can perform unit processes. The process apparatuses 220 are configured to perform separate semiconductor processes. In the service region 214, maintenance and repair work can be carried out for the process apparatuses 220 disposed in the process region 212. In the work region 216, operators or robots (not shown) are mobilized to perform their various operations, and a stocker 230 is disposed to temporarily store substrate transfer containers 100.

In the clean room 210, the substrate transfer containers 100 are placed in the process region 212 where semiconductor processes are to be performed. Also, the substrate transfer containers 100 can be moved between the process region 212 and the work region 216. During this time, the mass sensor 131 can be configured to continuously monitor for the presence of AMCs in the substrate transfer container 100; the temperature sensor 133 can be configured to measure the interior temperature of the substrate transfer container 100; the humidity sensor 135 can be configured to measure the interior humidity of the substrate transfer container 100; the particle sensor 137 can be configured to measure the number of particles present in the substrate transfer container 100; and the differential pressure sensor 139 can be configured to measure the a difference in pressure between the interior and exterior of the substrate transfer container 100. The sensors 131, 133, 135, 137, and 139 each generate detection signals that are provided to the first wireless transmitter 152, and the first wireless transmitter 152 transmits the received signals remotely via wireless signals, such as radio waves. In one embodiment, the signals are provided from the sensors to the wireless transmitter, and in turn, wirelessly transmitted, in real time.

The transmission signals of the first wireless transmitter 152 are amplified by one or more wireless signal amplifiers 242a, 242b, 242c, and 242d. The wireless signal amplifiers 242a, 242b, 242c, and 242d can optionally be disposed at a plurality of positions in the clean room 210. The wireless signal amplifiers 242a, 242b, 242c, and 242d have relatively stable reception regions, and the reception regions of the multiple signal amplifiers 242a, 242b, 242c, and 242d can be arranged so that they partially overlap with each other.

The signals amplified by the signal amplifiers 242a, 242b, 242c, and 242d are transmitted to a wireless receiver 244. In one embodiment, the wireless receiver 244 can be disposed in the work region 216. In other embodiments, the wireless receiver can be disposed at a location that is remote from the work region 216. The wireless receiver 244 can be configured to transmits the detection signals to a data management computer 246 positioned outside the clean room 210, or, alternatively, within the clean room. Signal transmission between the wireless receiver 244 and the data management computer 246 can be performed wirelessly, for example via radio waves, or can be performed via wires or cables. Based on the received signals, the data management computer 246 determines whether an environmental property of the interior of the substrate transfer container 100 has been compromised, or is otherwise in violation of a reference range, and, if so, the data management computer 246 can optionally take action such as generation of an alarm signal or other indication signal or automated action.

Figure 5:
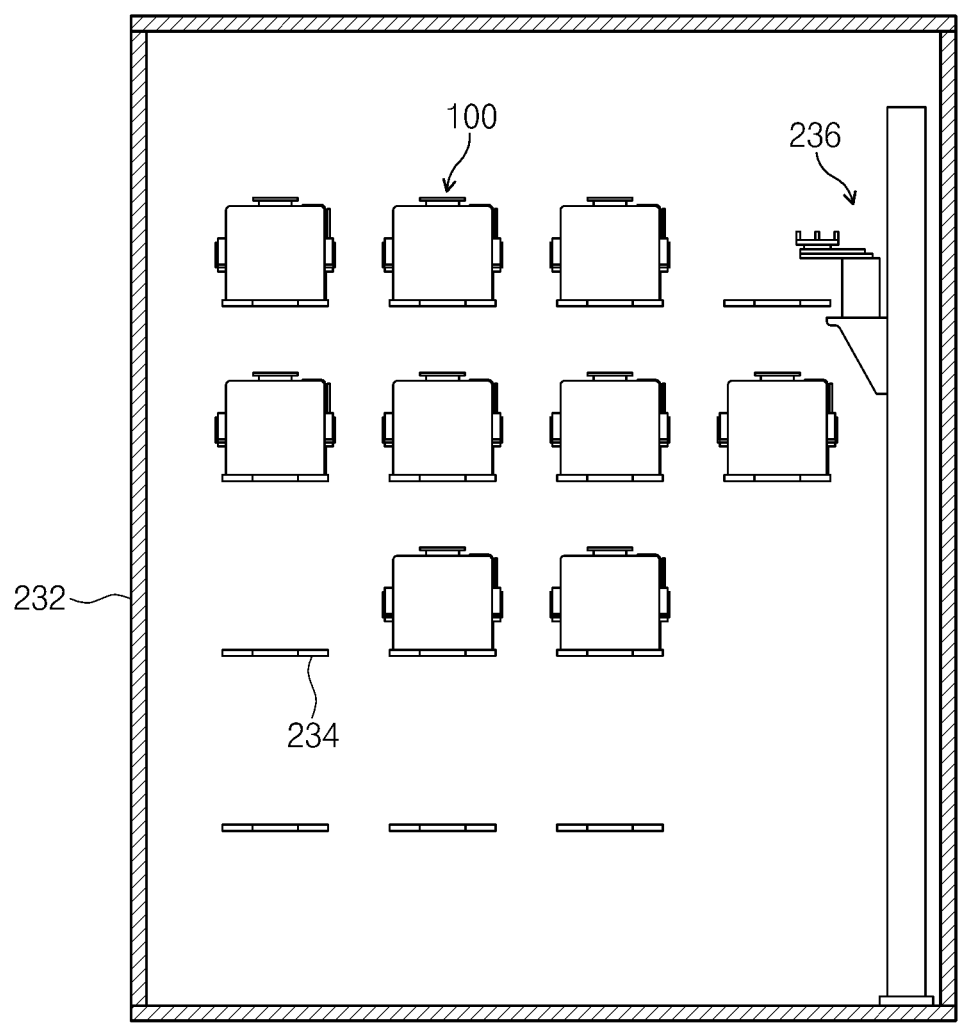
FIG. 5 is a sectional view illustrating an embodiment of the interior of a stocker of the type illustrated in FIG. 4.

FIG. 5 is a sectional view illustrating an embodiment of the interior of the stocker 230 illustrated in FIG. 4.

Referring to FIG. 5, the stocker 230 includes a stocker housing 232, support plates 234, and a transfer robot 236. The stocker housing 232 may have the approximate form of a rectangular parallelepiped shape. The support plates 234 are provided in the stocker 230 to receive substrate transfer containers 100. The support plates 234 can be arranged horizontally in lines at different heights, and purge units (not shown) may be provided respectively at the support plates 234 to supply a purge gas to the substrate transfer containers 100 placed on the support plates 234. The substrate transfer containers 100 can be loaded on the support plates 234, or unloaded from the support plates 234, by the transfer robot 236.

Although the substrate transfer containers 100 can be formed of a high-function plastic material, moisture may permeate the substrate transfer containers 100 due to the moisture-absorbing properties of plastic. In addition, although packings (not shown) are provided on the doors 120 of the substrate transfer containers 100, since perfect sealing is not guaranteed by the packings, the interior atmospheres of the substrate transfer containers 100 can, at times, be exposed to the external environment. As a result, the interior humidity and oxygen concentrations of the substrate transfer containers 100 can increase. To prevent this, when the substrate transfer containers 100 are temporarily stored in the stocker 230, the purge units (not shown) are configured to supply inert gas such as nitrogen gas into the substrate transfer containers 100 to replace the interior atmospheres of the substrate transfer containers 100 with nitrogen gas, or purge gas.

An explanation will now be given of a gas purge monitoring tool configured to monitor gas purge units and operations of the gas purge units in accordance with the present inventive concepts.

Figure 6:
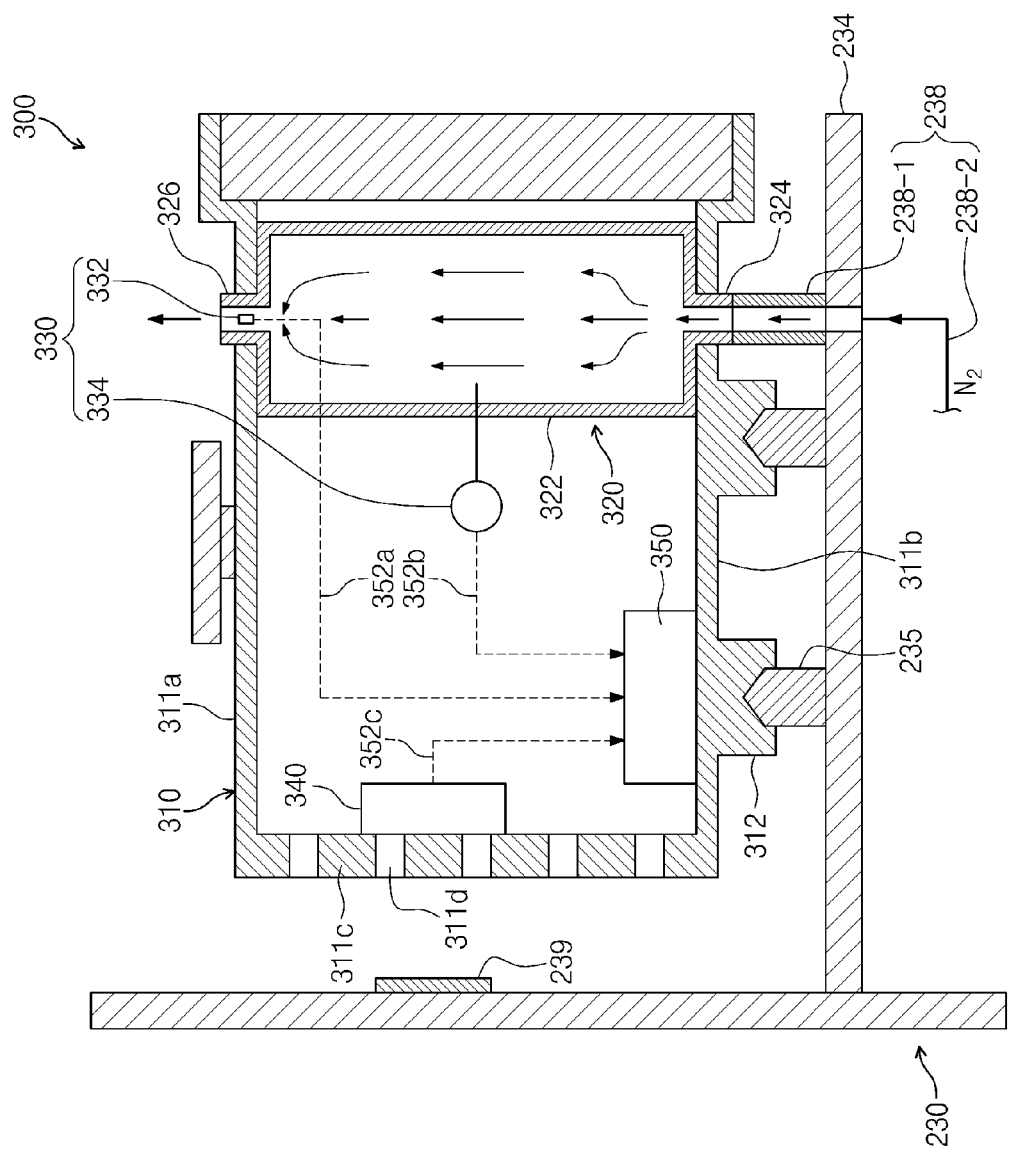
FIG. 6 is a view illustrating a purge unit and a gas purge monitoring tool according to an embodiment of the inventive concept.

FIG. 6 is a view illustrating a purge unit 238 and a gas purge monitoring tool 300. Referring to FIG. 6, the purge unit 238 includes a purge gas supply port 238-1 provided at the support plate 234 of the stocker 230, and a purge gas supply line 238-2 connected to the purge gas supply port 238-1. A gas supply source (not shown) may be connected to the purge gas supply line 238-2, and a valve (not shown) and a flow rate controller (not shown) may be provided at the purge gas supply line 238-2 to permit or restrict a flow of purge gas and to thereby control the flow rate of the purge gas.

Although not shown in FIG. 6, if a substrate transfer container 100 (refer to FIG. 1) is placed on the support plate 234, the purge gas supply port 238-1 is connected to an inlet port (not shown) of the substrate transfer container 100, and nitrogen gas is supplied into the inlet port (not shown) of the substrate transfer container 100 from the purge gas supply port 238-1. With the nitrogen gas supplied into the inlet port (not shown) of the substrate transfer container 100, the interior atmosphere of the substrate transfer container 100 is replaced with the nitrogen gas. As a result, the interior humidity and oxygen concentration of the substrate transfer container 100 can be stabilized and prevented from being increased.

As shown in FIG. 6, the gas purge monitoring tool 300 is placed on the support plate 234 at a vacant location at which a substrate transfer container 100 is not loaded, to thereby monitor whether the purge unit 238 is operating normally. In one embodiment, the gas purge monitoring tool 300 can include a container 310, a gas chamber 320, a second detection unit 330, an identification number reader 340, and a signal transmission module 350.

The container 310 can have the same outer shape as that of the substrate transfer container 100 (refer to FIG. 1), and locators 312, for example in the form of grooved features, are provided on a bottom wall 311b of the container 310. When the container 310 is placed in proper position on the support plate 234, pins 235 protruding from the top surface of the support plate 234 register with the locators 312 so that the container 310 can be positioned. In this manner, the container 310 of the purge monitoring tool 300 registers with the support plate 234 in the same manner as the substrate transfer containers 100. When the container 310 is placed at a proper position, the purge gas supply port 238-1 of the purge unit 238 is connected to a purge gas inlet port 324 of the gas chamber 320, as described below. It is not required that a slotted structure for housing substrates be formed in the container 310; rather the container 310 is constructed and arranged so that the gas chamber 320 of the container is disposed to receive nitrogen gas supplied from the purge unit 238.

In one example embodiment, the gas chamber 320 includes a chamber body 322, the purge gas inlet port 324, and a purge gas outlet port 326. The chamber body 322 has a hollow container shape and is disposed in the gas chamber 320. In one embodiment, the chamber body 322 comprises metal, metal alloy, or a synthetic material suitable for containing a gas and such that moisture may not permeate the chamber body 322. The purge gas inlet port 324 is provided at the bottom side of the chamber body 322 and communicates with the interior of the chamber body 322. In the present example embodiment, the purge gas inlet port 324 penetrates the bottom wall 311b of the container 310, and the purge gas outlet port 326 penetrates a top wall 311a of the container 310. In one example embodiment, the purge gas inlet port 324 and purge gas outlet port are opposite each other so as to face each other. Nitrogen gas can be supplied to the purge gas inlet port 324 of the gas chamber 320 from the purge gas supply port 238-1 of the purge unit 238, and, when the chamber body 322 is filled with the nitrogen gas, a portion of the nitrogen gas is discharged through the purge gas outlet port 326.

In one embodiment, a cross section of the purge gas outlet port 326 taken in a direction perpendicular to a purge gas flow direction from the purge gas inlet port 324 to the purge gas outlet port 326 is smaller in area than a cross section of the chamber body 322 taken in a direction perpendicular to the purge gas flow direction. Therefore, when the chamber body 322 is filled with nitrogen gas, the inside pressure of the chamber body 322 can be pressurized.

In one embodiment, the second detection unit 330 includes a humidity sensor 332 and a pressure sensor 334. The humidity sensor 332 can be disposed at the purge gas outlet port 326 to measure the humidity of any nitrogen gas being discharged through the purge gas outlet port 326. In one example embodiment, an electric-resistance humidity sensor or a capacitance humidity sensor can be employed as the humidity sensor 332. The pressure sensor 334 can be disposed at the chamber body 322 to measure the pressure of nitrogen gas in the chamber body 322.

The identification number reader 340 determines an identification number 239 of the purge unit 238. The identification number 239, for example in the form of a bar code can be provided on a wall of the stocker 230 to which where the support plate 234 of the purge unit 238 is coupled. Specifically, the identification number 239 of the purge unit 238 may be provided on a wall of the stocker 230 at a position facing a rear side wall 311c of the container 310 disposed on the support plate 234. The identification number reader 340 such as a bar code reader may be disposed on the rear side wall 311c of the container 310 at a position facing the identification number 239. In various embodiments, the identification number reader 340 can be disposed on the inner or outer surface of the rear side wall 311c of the container 310. In a case where the identification number reader 340 is positioned at the inner surface of the rear side wall 311c, one or more openings 311d can be formed through the rear side wall 311c so that the identification number reader 340 can inspect the identification number 239 through the openings 311d.

The signal transmission module 350 receives detection signals from the humidity sensor 332 and the pressure sensor 334, and a signal providing information about the identification number of the purge unit 238 from the identification number reader 340. The signal transmission module 350 in turn transmits the signals wirelessly, for example via radio waves, so that the signals can be monitored remotely. The signal transmission module 350 is a second wireless transmitter. The signal transmission module 350 can be electrically connected to the humidity sensor 332 through a cable 352a, the pressure sensor 334 through a cable 352b, and the identification number reader 340 through a cable 352c.

Referring to FIGS. 4 through 6, the gas purge monitoring tool 300 can be transported and moved among the plurality of support plates 234 of the stocker 230 to determine the performance and proper operation of the associated purge units 238. Feedback signals can be provided to a remote system wirelessly, for example in the manner described above in connection with the substrate transfer containers 100. This helps to ensure a stable operating environment in the clean room 210.

When the gas purge monitoring tool 300 is placed on a support plate 234 where a purge unit 238 to be monitored is disposed, nitrogen gas is introduced from the purge gas supply port 238-1 of the purge unit 238 to the purge gas inlet port 324 of the gas chamber 320. The supplied nitrogen gas fills the inner volume of the chamber body 322 and is discharged through the purge gas outlet port 326. The humidity sensor 332 measures the humidity of the nitrogen gas that is present in, or being discharged through, the purge gas outlet port 326; the pressure sensor 334 measures the interior gas pressure of the chamber body 322; and the identification number reader 340 reads the identification number 239 of the purge unit 238 being monitored.

Detection signals of the sensors 332 and 334 and a signal associated with the read identification number 239 are transmitted to the signal transmission module 350, and the signal transmission module 350 transmits the signals wirelessly to the signal amplifiers 242a, 242b, 242c, and 242d disposed in the clean room 210, as shown in FIG. 4 above. The signal amplifiers 242a, 242b, 242c, and 242d amplify the signals received from the signal transmission module 350 and transmit the respective amplified signals to the wireless receiver 244. The wireless receiver 244 transmits the signals to the data management computer 246. The data management computer can be disposed outside the clean room 210, or optionally, within the clean room. By reviewing the received signals, the data management computer 246 can determine whether the purge unit 238 being monitored is operating normally. In a case where the data management computer 246 makes a determination that the purge unit 238 is or has been operating abnormally, any substrates accommodated in a substrate transfer containers 100 that have been processed by that abnormally operating purge unit can be addresses, for example, discarded or otherwise excluded from further processing. At this time, the identification number of the purge unit 238 is recognized by the read identification number 239, and the substrates may be recognized by tracking the movement of the substrate transfer container 100 or by referring to the process history of the substrate transfer container 100.

Figure 7:
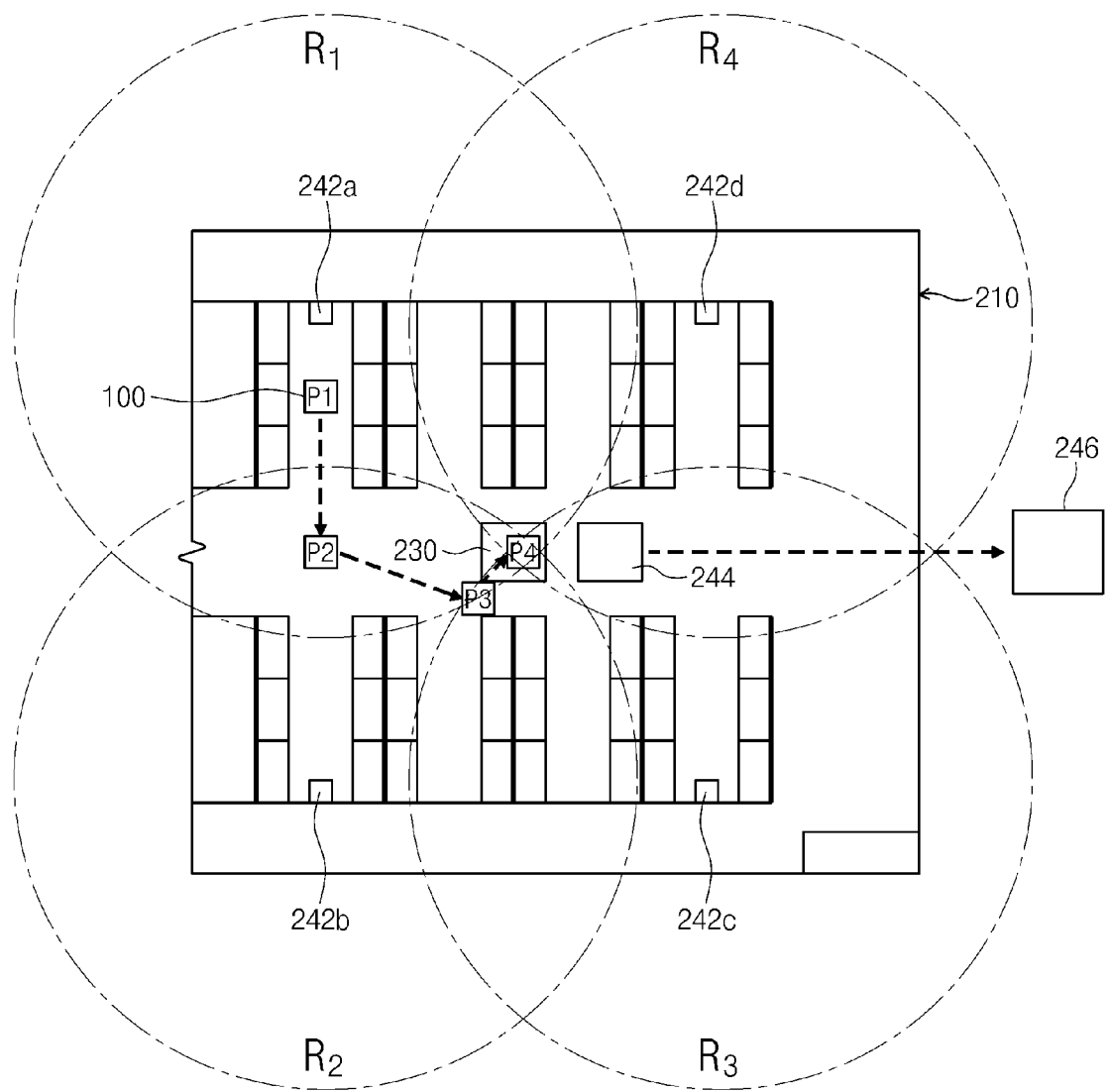
FIG. 7 illustrates a method for tracking a substrate transfer container 100 as it undergoes processing by semiconductor manufacturing equipment, according to an embodiment of the inventive concept.

FIG. 7 illustrates a method for tracking a substrate transfer container 100 as it undergoes processing by semiconductor manufacturing equipment, according to an embodiment of the inventive concept. Referring to FIGS. 1, 4 and 7, the signal amplifiers 242a, 242b, 242c, and 242d can be disposed at, for example, four positions, in the clean room 210. In this example, the signal amplifiers 242a, 242b, 242c, and 242d have reception regions $R_1$, $R_2$, $R_3$, and $R_4$, respectively. The reception regions $R_1$, $R_2$, $R_3$, and $R_4$ can be generally constant in radius and position, relative to the position of the amplifiers 242a, 242b, 242c, and 242d.

In one embodiment, the position of a substrate transfer container 100 in the clean room 210 can be determined based on the reception regions $R_1$, $R_2$, $R_3$, and $R_4$ of the signal amplifiers 242a, 242b, 242c, and 242d or by overlapping regions among the reception regions $R_1$, $R_2$, $R_3$, and $R_4$ when the signal amplifiers 242a, 242b, 242c, and 242d receive a signal transmitted from the first wireless transmitter 152.

In the present example of FIG. 7, in a case where the substrate transfer container 100 is placed at position P1, only the first signal amplifier 242a receives a signal transmitted from the first wireless transmitter 152, and thus it is determined that the substrate transfer container 100 is placed in the reception region $R_1$ proximal to the first signal amplifier 242a.

If the substrate transfer container 100 is placed at position P2, the first and second signal amplifiers 242a and 242b receive a signal transmitted from the first wireless transmitter 152, and thus it is determined that the substrate transfer container 100 is placed in an overlapping region between the reception regions $R_1$ and $R_2$.

If the substrate transfer container 100 is placed at a position P3, the first to third signal amplifiers 242a, 242b, and 242c receive a signal transmitted from the first wireless transmitter 152, and thus it is determined that the substrate transfer container 100 is placed in an overlapping region among the reception regions $R_1$, $R_2$, and $R_3$.

If the substrate transfer container 100 is placed at a position P4, the first to fourth signal amplifiers 242a, 242b, 242c, and 242d receive a signal transmitted from the first wireless transmitter 152, and thus it is determined that the substrate transfer container 100 is placed in an overlapping region among the reception regions $R_1$, $R_2$, $R_3$, and $R_4$.

In this way, the position of the substrate transfer container 100 can be determined at a given time, and the travel path of the substrate transfer container 100 in the clean room 210 can be determined by tracking the position of the substrate transfer container 100 over time, and optionally, in real time.

In the embodiment, four signal amplifiers are used. However, fewer or more signal amplifiers may be disposed at fewer or more positions. As the number of signal amplifiers increases, the position of a substrate transfer container can be traced more precisely.

Alternatively, the position of the substrate transfer container 100 can be determined based on the relative strengths of the signal transmitted from the first wireless transmitter 152, as received by the first to fourth signal amplifiers 242a, 242b, 242c, and 242d. In this embodiment, the position of the first wireless transmitter 152 can be determined based on triangulation, in response to the relative strengths of the signals received by the signal amplifiers 242a, 242b, 242c, and 242d.

As described above, according to the embodiments of the inventive concept, contamination of substrates present in a substrate transfer container can be monitored directly by using sensors disposed in the substrate transfer container. Contamination of the substrates can further be determined indirectly by using the purge gas monitoring tool configured to determine whether a purge unit configured to supply a purge gas into the substrate transfer container is operating normally.

According to an inventive concept, environmental properties such as AMCs, temperature/humidity, presence of particles, and pressure differences can be monitored in real time for each substrate transfer container in a clean room environment.

Further, according to an inventive concept, the position of the substrate transfer container can be tracked in the clean room.

Further, according to the inventive concept, proper operation of one or more purge units responsible for supplying a purge gas into the substrate transfer container can be monitored, and thus it can be determined whether substrates present in the substrate transfer container have been subjected to possible contamination.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. Semiconductor manufacturing equipment comprising:
a clean room in which process apparatus are disposed to perform semiconductor manufacturing processes; and
a substrate transfer container constructed and arranged to retain a plurality of substrates subject to a manufacturing process and to be transported among the process apparatus,
wherein the substrate transfer container comprises:
a housing including a plurality of substrate slots, each substrate slot for retaining a substrate subject to a manufacturing process;
a door constructed and arranged to seal an interior environment of the housing;
a first detection unit at the housing to detect an environmental property of the interior environment; and a first wireless transmitter configured to transmit a detection signal received from the detection unit, wherein the wireless transmitter is positioned at an outer wall of the housing and includes a flexible cable positioned along an inner wall, an opening and the outer wall of the housing, electrically connecting the detection unit and the wireless transmitter;
the semiconductor equipment further comprising:
signal amplifiers positioned at a plurality of locations in the clean room and configured to amplify the detection signal transmitted from the first wireless transmitter and to transmit the amplified signal to a receiver;
a stocker housing positioned in the clean room;

a plurality of support plates arranged vertically in the stocker housing to temporarily store the substrate transfer container;

purge units respectively provided at the support plates to supply a purge gas to the substrate transfer container placed on the support plate; and a gas purge monitoring tool configured to monitor whether the purge units operate normally, wherein the gas purge monitoring tool comprises:

a container constructed and arranged to be placed on a vacant one of the support plates;

a gas chamber in the container, the gas chamber constructed and arranged to receive an inert purge gas supplied from purge unit and to selectively vent the received inert purge gas;

a second detection unit configured to detect an environmental property of an interior environment of the gas chamber; and a second wireless transmitter configured to wirelessly transmit a detection signal received from the second detection unit to the signal amplifiers.

2. The semiconductor manufacturing equipment of claim 1, wherein the gas chamber comprises:

a chamber body in the container;

a purge gas inlet port at a lower portion of the chamber body; and a purge gas outlet port at an upper portion of the chamber body, wherein the purge gas outlet port has a cross-section taken in a direction perpendicular to a direction of purge gas flow between the lower portion and the upper portion that is smaller in area than a cross-section of the chamber body taken in a direction perpendicular to the purge gas flow direction, and wherein the purge gas inlet port and the purge gas outlet port penetrate an outer wall of the container.

3. The semiconductor manufacturing equipment of claim 2, wherein the second detection unit comprises:

a humidity sensor at the purge gas outlet port to measure humidity of purge gas discharged through the purge gas outlet port; and a pressure sensor at the chamber body to measure a purge gas pressure in the chamber body.

4. The semiconductor manufacturing equipment of claim 1, wherein the gas purge monitoring tool further comprises an identification number reader configured to read identification numbers provided of purge units to which the gas purge monitoring tool is mounted and to and deliver the read identification numbers to the second wireless transmitter.

* * * * *